United States Patent
Moon

(10) Patent No.: US 7,368,315 B2
(45) Date of Patent: May 6, 2008

(54) X-RAY DETECTING DEVICE AND FABRICATING METHOD THEREOF

(75) Inventor: Kyo Ho Moon, Daegu-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 1098 days.

(21) Appl. No.: 10/025,903

(22) Filed: Dec. 26, 2001

(65) Prior Publication Data

US 2002/0154234 A1    Oct. 24, 2002

(30) Foreign Application Priority Data

Dec. 29, 2000    (KR)    .......................... 10-2000-85281

(51) Int. Cl.
*H01L 21/00*    (2006.01)
(52) U.S. Cl. .................. 438/98; 438/714; 438/738; 250/370.01; 250/370.08; 250/370.09
(58) Field of Classification Search ............ 438/98, 438/738, 714; 250/370.01, 370.08, 370.09
See application file for complete search history.

(56) References Cited

U.S. PATENT DOCUMENTS

| | | | |
|---|---|---|---|
| 6,218,206 B1 * | 4/2001 | Inoue et al. | 438/30 |
| 6,323,490 B1 * | 11/2001 | Ikeda et al. | 250/370.09 |
| 6,326,249 B1 * | 12/2001 | Yamazaki et al. | 438/158 |
| 6,403,965 B1 * | 6/2002 | Ikeda et al. | 250/370.09 |
| 6,480,577 B1 * | 11/2002 | Izumi et al. | 379/40 |
| 6,507,026 B2 * | 1/2003 | Ikeda et al. | 250/370.09 |
| 6,617,584 B2 * | 9/2003 | Choo et al. | 250/370.01 |
| 6,696,324 B2 * | 2/2004 | Hong et al. | 438/149 |
| 6,784,434 B2 * | 8/2004 | Hennessy et al. | 250/370.14 |
| 6,927,175 B2 * | 8/2005 | Moon | 438/738 |
| 2001/0022363 A1 * | 9/2001 | Nagata et al. | 257/59 |
| 2002/0123176 A1 * | 9/2002 | Izumi et al. | 438/149 |
| 2002/0154235 A1 * | 10/2002 | Kim | 348/311 |

* cited by examiner

*Primary Examiner*—George R. Fourson
*Assistant Examiner*—John M. Parker
(74) *Attorney, Agent, or Firm*—McKenna Long & Aldridge LLP

(57) ABSTRACT

An X-ray detecting device and a fabricating method thereof that is capable of preventing breakage of a transparent electrode. In the device and method, a contact hole passing through a protective film is formed centering around a contact hole passing through a storage insulating film. Accordingly, step coverage of a transparent electrode provided on the protective film can stabilized to prevent breakage of the transparent electrode.

15 Claims, 14 Drawing Sheets

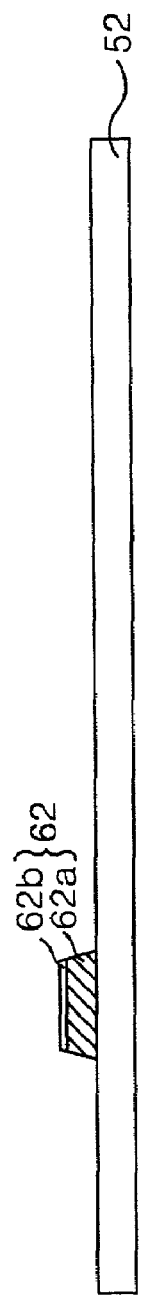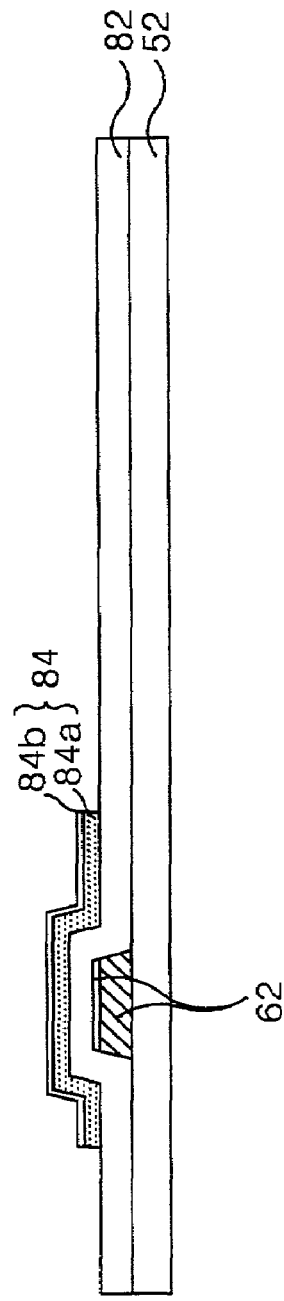

X-RAY DETECTING DEVICE AND FABRICATING METHOD THEREOF

This application claims the benefit of Korean Patent Application No. P2000-85281, filed on Dec. 29, 2000, which is hereby incorporated by reference for all purposes as if fully set forth herein.

BACKGROUND OF THE INVENTION

1. Field of the Invention

The present invention relates to an X-ray detector, and more particularly to an X-ray detecting device and a fabricating method thereof that is capable of preventing breakage of a transparent electrode.

2. Discussion of the Related Art

Generally, an X-ray imaging system for photographing an object using a non-visible light ray such as an X-ray, etc. has been used for medical, science and industry applications. This X-ray imaging system includes an X-ray detecting panel for detecting an X-ray passing through an object to convert the X-ray into an electrical signal.

As shown in FIG. 1, the X-ray detecting panel includes a photo sensitive layer 6 for detecting an X-ray, and a thin film transistor array 4 provided on a substrate 2 to switch and output the detected X-ray signal from the photo sensitive layer 6. The thin film transistor array 4 includes pixel electrodes 5 arranged in a pixel unit, and thin film transistors (TFT's), each of which is connected to a charging capacitor Cst, a gate line 3 and a data line (not shown). On the upper portion of the photo-sensitive layer 6 is provided a dielectric layer 7 and an upper electrode 8, which is connected to a high voltage generator 9. The photo-sensitive layer 6 made from a selenium with a thickness of hundreds of micrometers μm detects an incident X-ray to convert it into an electrical signal. In other words, the photo-sensitive layer 6 produces an electron-hole pair when an X-ray is incident thereto and separates the electron-hole pair when a high voltage of several kV generated from the high voltage generator 9 is applied to the upper electrode 8. Holes separated from electrons are charged in the charging capacitor Cst by way of the pixel electrode 5, and a portion of the holes is accumulated on the surface of the pixel electrode 5. This results in the number of holes accumulated in the charging capacitor Cst being reduced. In order to prevent such a reduction, a charge blocking layer 11 is formed on the pixel electrode 5. The thin film transistor (TFT) responds to a gate signal inputted over the gate line 3 to apply a voltage charged in the charging capacitor Cst to the data line. Pixel signals supplied to the data line are applied to a display device via a data reproducer, thereby displaying a picture.

FIG. 2 is a cross-sectional view showing a structure of a conventional X-ray detecting device and illustrates a thin film transistor part and a storage capacitor part.

Referring to FIG. 2, the substrate 2 of the X-ray detecting device is provided with a gate electrode 12, a semiconductor layer 34 formed with having the gate electrode and a gate insulating film 32 therebetween, a source electrode 14 and a drain electrode 16 separately formed on the semiconductor layer 34. In order to protect such a thin film transistor part, a storage insulating film 38 and first and second protective films 40 and 36 are provided. A first drain contact hole 15a passing through the storage insulating film 38 and the first protective film 40 are provided on the storage insulating film 38 and the first protective film 40, whereas a second drain contact hole 15b passing through the second protective films 36 is provided. The drain electrode 16 electrically contacts a transparent drain electrode 27 provided on the first protective film 40 via the first drain contact hole 15a. Further, the transparent drain electrode 27 electrically contacts the pixel electrode 5 provided on the second protective film 36 via the second contact hole 15b. Thus, the drain electrode 16 is in electrical contact with the pixel electrode 5 via the first and second contact holes 15a and 15b.

The charge capacitor part Cst consists of a storage electrode 25, and the pixel electrode 5 positioned over the storage electrode 25 with the second protective film 36 therebetween. A ground line 22 for resetting residual charges of the charging capacitor Cst contacts the lower portion of the storage electrode 25. The ground line 22 and the storage electrode 25 are in electrical contact with each other via a storage contact hole 17 through the storage insulating film 38 and the first protective film 40.

FIG. 3A to FIG. 3G are section views showing a method of fabricating the X-ray detecting device shown in FIG. 2, and illustrate the thin film transistor part and the storage capacitor part.

First, the gate electrode 12 is formed by sequentially depositing first and second gate metals 12a and 12b onto the substrate 2 and then patterning them as shown in FIG. 3A.

As shown in FIG. 3B, the gate insulating film 32, an active layer 34a and an ohmic contact layer 34b are formed by depositing an insulating material and first and second semiconductor materials onto the entire surface of the substrate 2 provided with the gate electrode 12 and then patterning the first and second semiconductor materials.

After formation of a semiconductor layer 34, as shown in FIG. 3C, the source 14, the drain electrode 16 and the ground line 22 are formed by depositing a data metal onto the gate insulating film 32 and patterning it as shown in FIG. 3C. The storage insulating film 38 and the first protective film 40 are formed by depositing first and second insulating materials on the substrate 2 provided with the source electrode 14, the drain electrode 16 and the ground line 22. The first drain contact hole 15a and the storage contact hole 17 are defined by patterning the storage insulating film 38 and the first protective film 40 as shown in FIG. 3D.

Subsequently, as shown in FIG. 3E, a transparent drain electrode 27 and a storage electrode 25 in contact with the drain electrode 16 and the ground line 22 are formed by depositing a transparent conductive material on the first protective film 40 and then patterning it.

As shown in FIG. 3F, the second protective film 36 and the second drain contact hole 15b are formed by depositing an insulating material onto the first protective film 40 and patterning it in such a manner to cover the transparent drain electrode 27 and the storage electrode 25.

Finally, as shown in FIG. 3G, the pixel electrode 5 electrically connected to the transparent drain electrode 27 via the second drain contact hole 15b is formed by depositing a transparent conductive material onto the second protective film 36 and then patterning it.

The first drain contact hole 15a and the storage contact hole 17 of the conventional X-ray detecting device are formed by simultaneously patterning the storage insulating film 38 and the first protective film 40 using a dry etching technique. In this case, the storage insulating film 38 and the first protective film 40 are formed from an inorganic insulating material and an organic material having a different etching rate, respectively. This forces an etching rate of the storage insulating film 38 to be faster than that of the first protective film 40 to over-etch the storage insulating film 38 in comparison to the first protective film 40, thereby causing an undercut phenomenon. This undercut phenomenon allows the transparent conductive material deposited on the first protective film 40 to have a poor step coverage, thereby causing a problem of a breakage of the transparent drain electrode 27 and the storage electrode 25.

SUMMARY OF THE INVENTION

Accordingly, the present invention is directed to an X-ray detecting device and a fabricating method thereof that is capable of preventing a breakage of a transparent electrode.

In order to achieve these and other advantages of the invention, an X-ray detecting device according to one aspect of the present invention includes a thin film transistor having a gate electrode, a source electrode and a drain electrode provided on a substrate; a first protective film covering the thin film transistor; a first drain contact hole passing through the first protective film; a second protective film provided on the first protective film; a second drain contact hole passing through the second protective film centering around the drain contact hole; and a transparent electrode connected to the drain electrode via the first and second drain contact holes.

In the X-ray detecting device, the second drain contact hole has a smaller width than the first drain contact hole.

The X-ray detecting device further includes a ground line formed from the lower electrode of a storage capacitor on the substrate; a first storage contact hole passing through the first protective film covering the ground line; a second storage contact hole passing through the second protective film centering around the first storage contact hole; and a storage electrode electrically connected to the ground line via the first and second storage contact holes.

The first protective film is made from an inorganic insulating material.

The second protective film is made from an organic insulating material.

The X-ray detecting device further includes a third protective film provided on the second protective film; and a pixel electrode electrically connected to the drain electrode via a contact hole passing through the third protective film.

The second storage contact hole has a smaller width than the first storage contact hole.

A method of fabricating an X-ray detecting device according to another aspect of the present invention includes providing a gate electrode on a substrate; providing a gate insulating film on the substrate; providing a semiconductor layer on the gate insulating film; providing a source electrode and a drain electrode on the gate insulating film; providing a first protective film on the gate insulating film; providing a first drain contact hole passing through the first protective film; providing a second protective film on the first protective film; providing a second drain contact hole passing through the second protective film centering around the first drain contact hole; and providing a transparent electrode on the second protective film.

In the method, the first drain contact hole has a larger width than the second drain contact hole.

The method further includes forming a ground line simultaneously with the source and drain electrodes; forming a first storage contact hole passing through the first protective film covering the ground line; forming a second storage contact hole passing through the second protective film provided on the first protective film centering around the first storage contact hole; and forming a transparent electrode on the second protective film.

The method further includes the steps of forming a third protective film on the second protective film; and forming a pixel electrode on the third protective film.

The first storage contact hole has a larger width than the second storage contact hole.

The first protective film is made from an inorganic insulating material.

The second protective film is made from an organic insulating material.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

Figure 1:
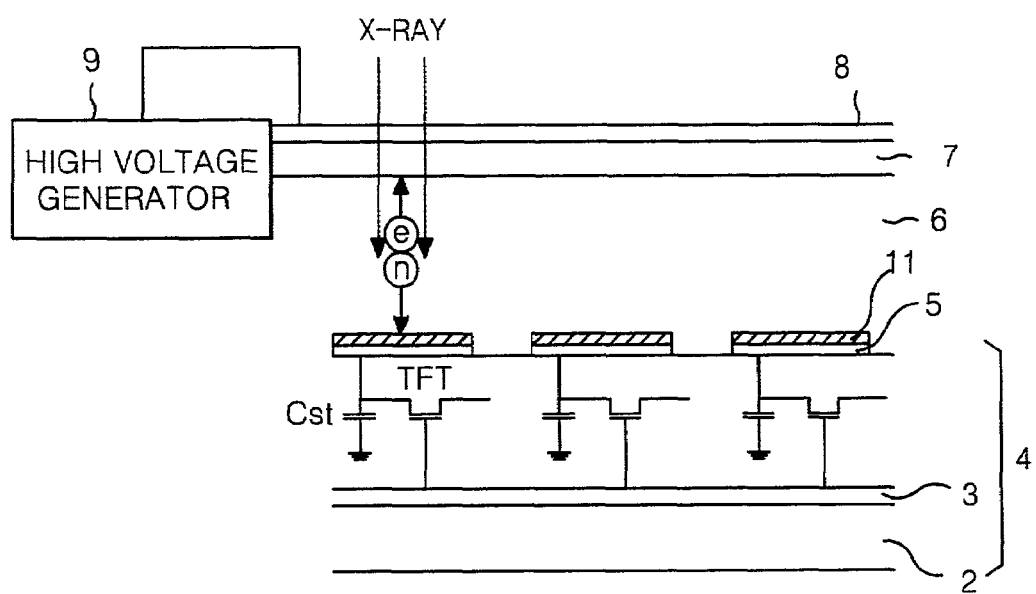
FIG. 1 is a schematic block circuit view showing a panel structure of a conventional X-ray detecting device.
Figure 2:
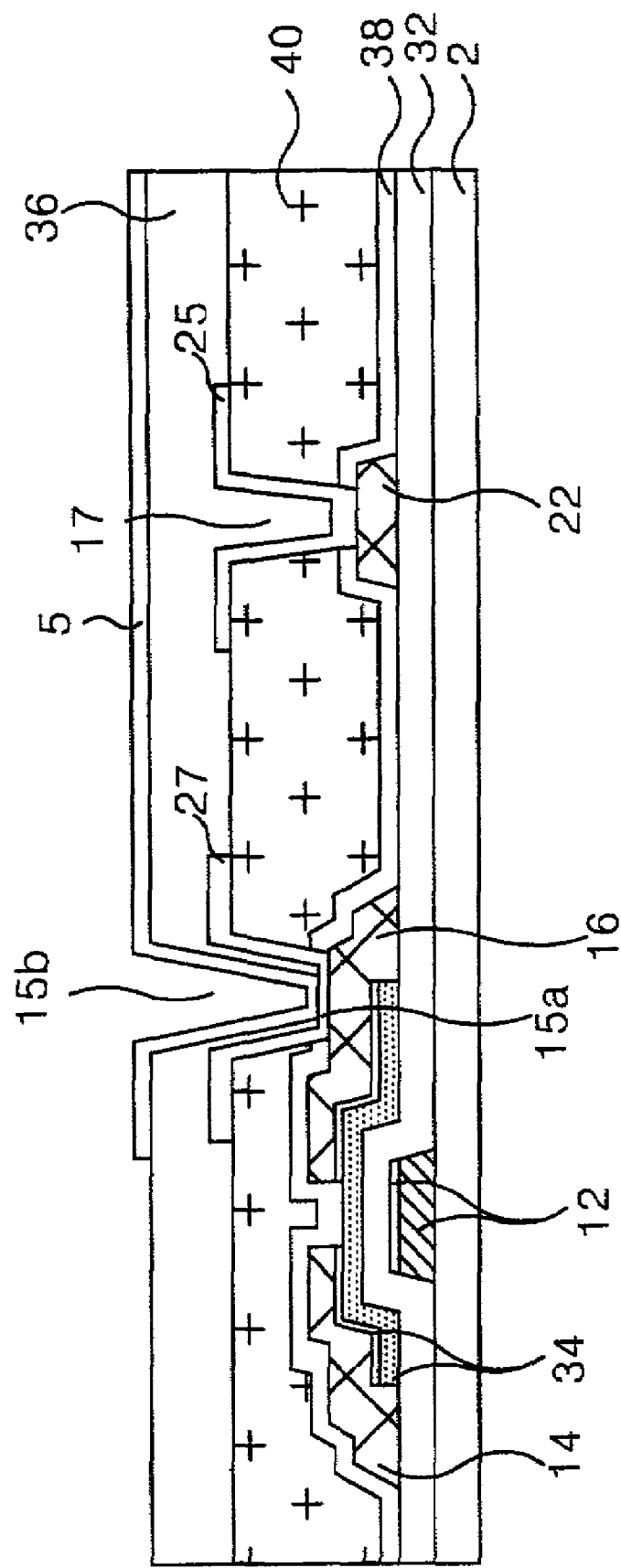
FIG. 2 is a section view showing a structure of the X-ray detecting device shown in FIG. 1.
Figure 3A:
FIG. 3A to FIG. 3G are section views showing a method of fabricating the X-ray detecting device shown in FIG. 2.
Figure 3B:
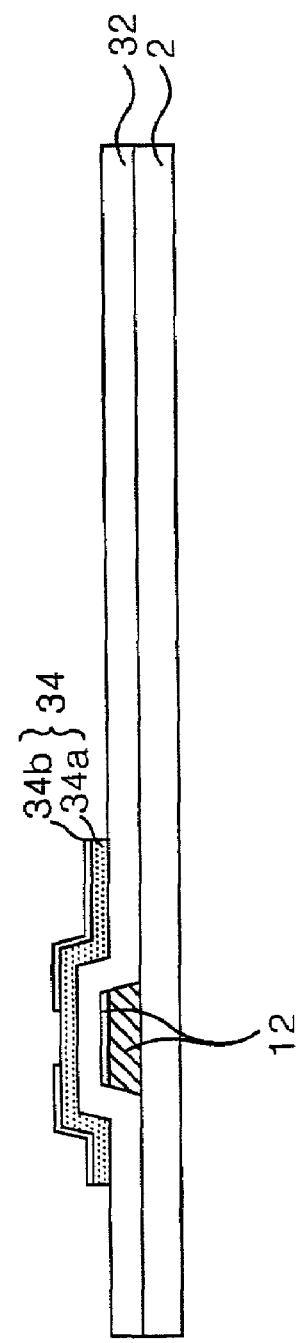
Figure 3C:
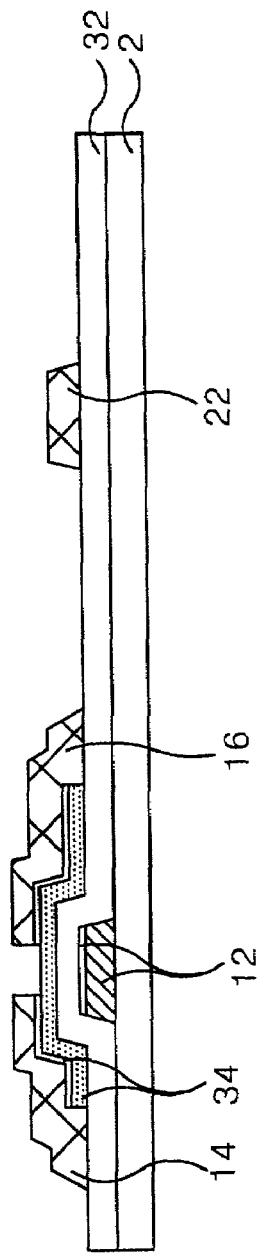
Figure 3D:
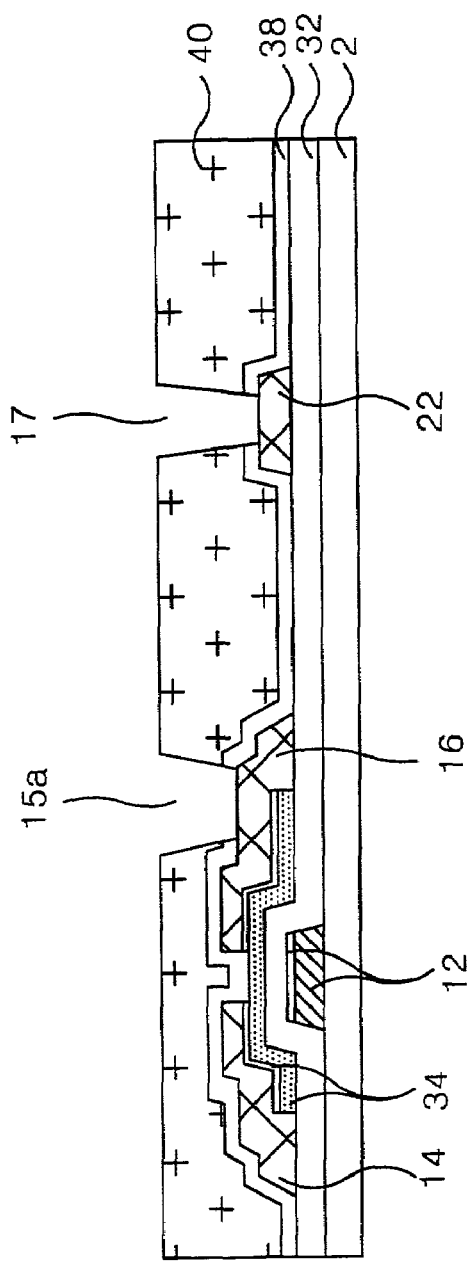
Figure 3E:
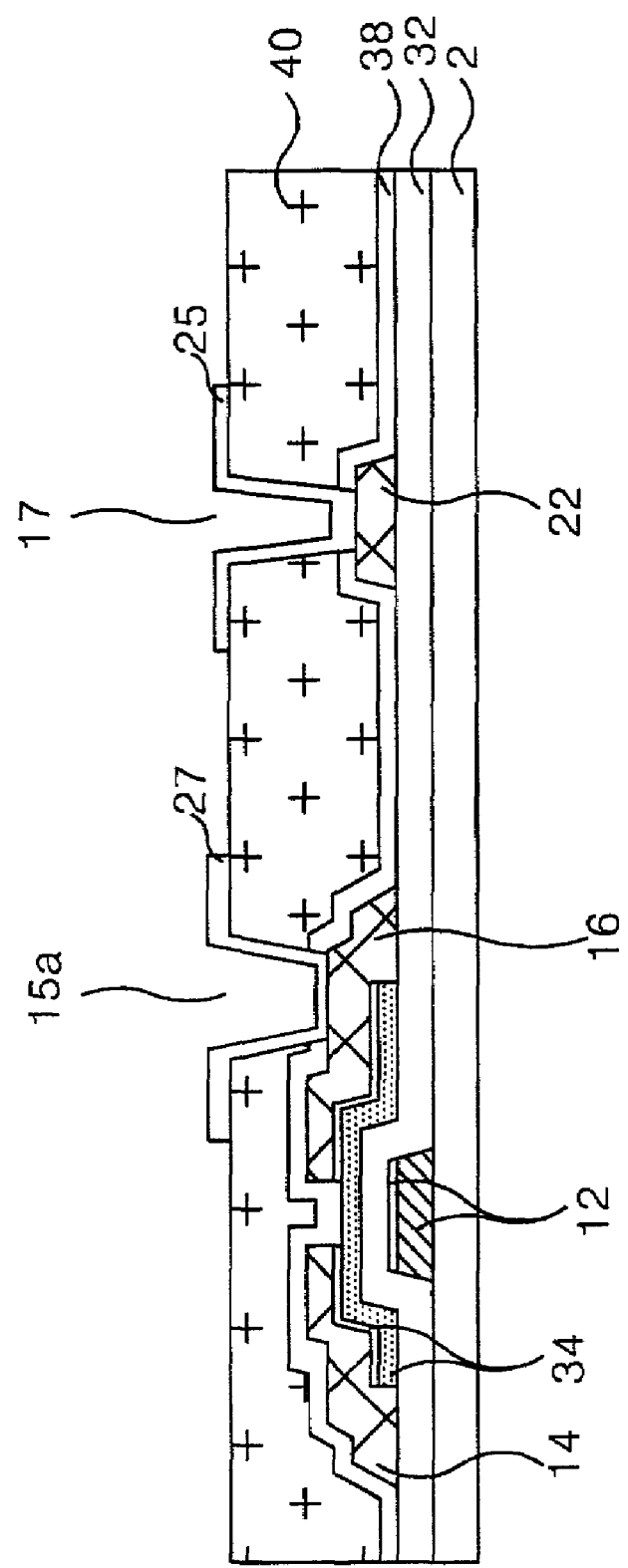
Figure 3F:
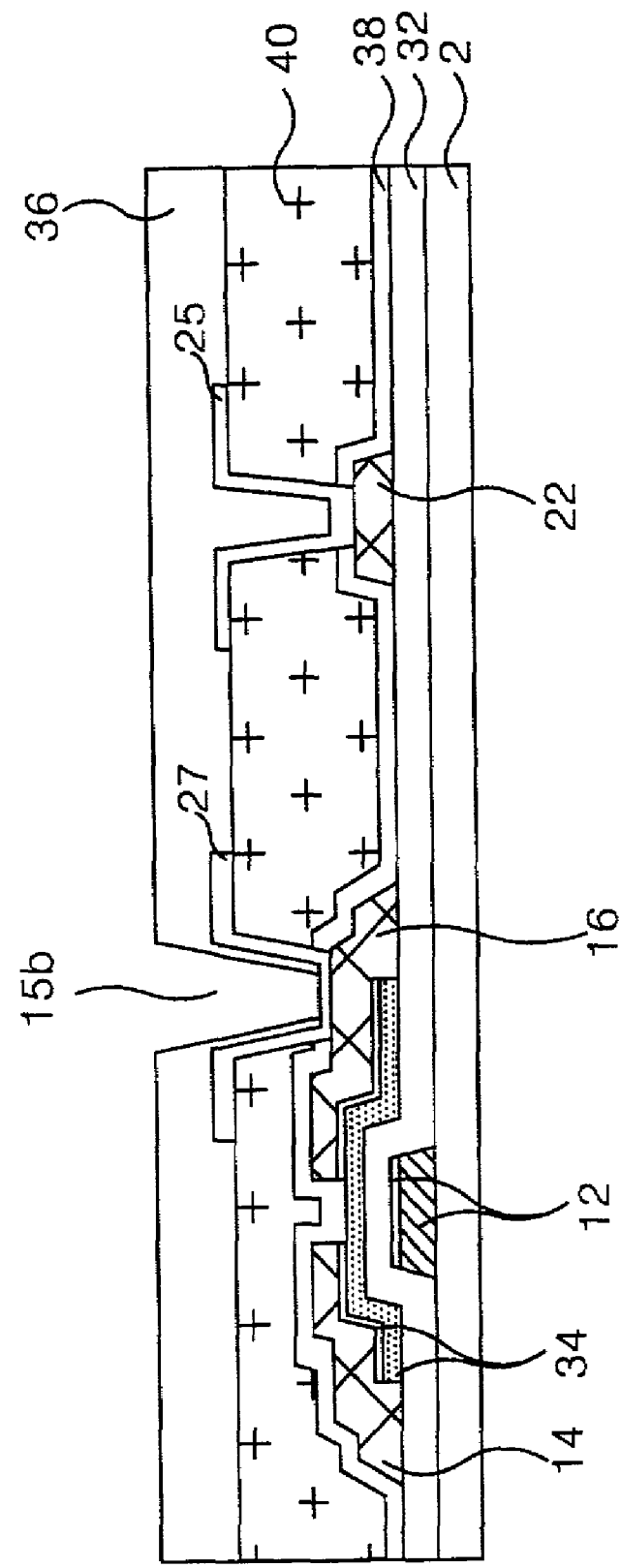
Figure 3G:
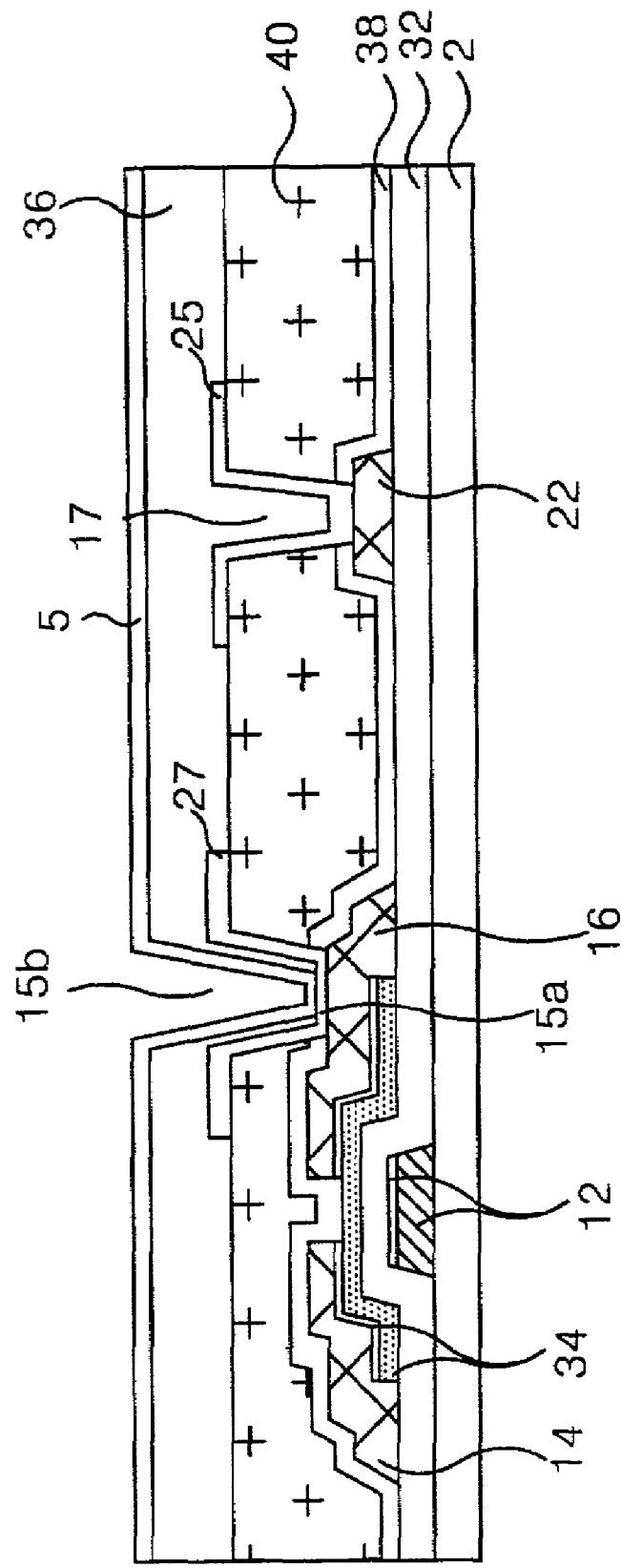
Figure 4:
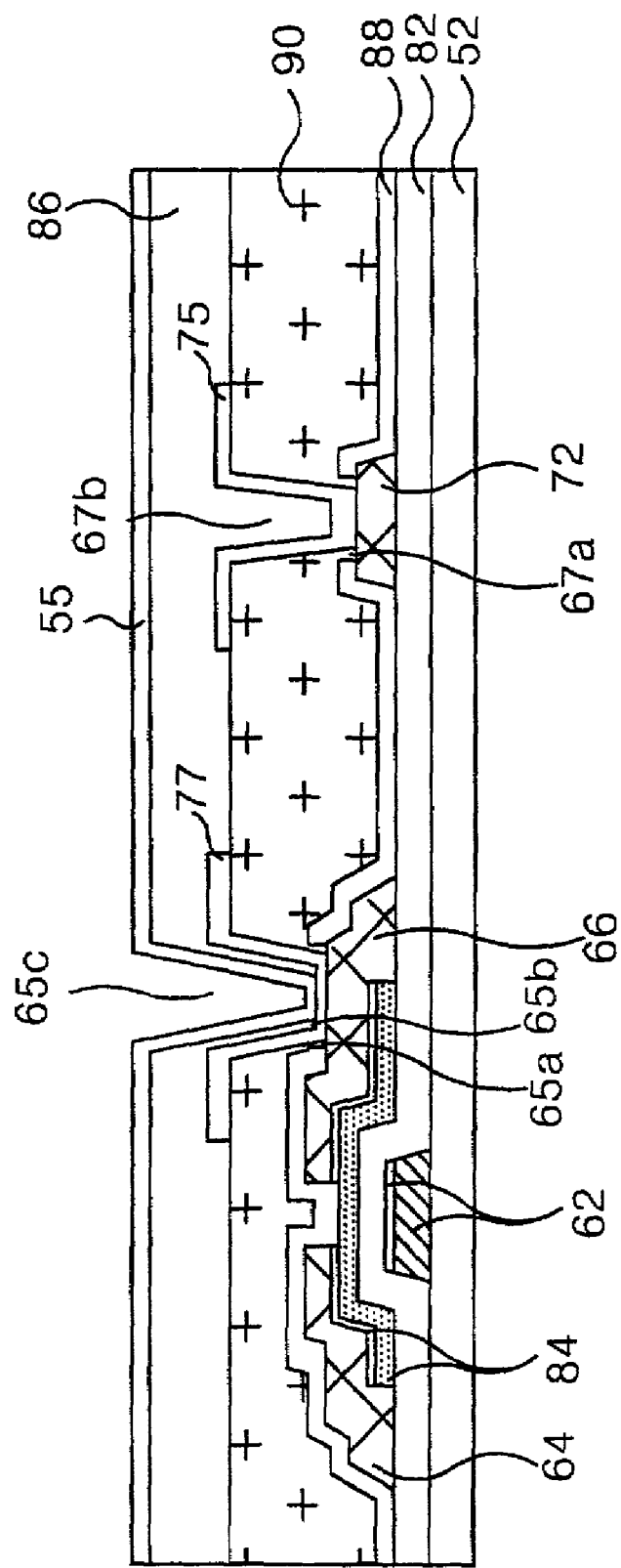
FIG. 4 is a section view showing a structure of an X-ray detecting device according to an embodiment of the present invention.

FIG. 4 is a section view showing a structure of an X-ray detecting device according to an embodiment of the present invention and illustrates a thin film transistor part and a storage capacitor part.

Referring to FIG. 4, a substrate 52 of the X-ray detecting device is provided with a gate electrode 62, a gate insulating film 83, a semiconductor layer 84 disposed over the gate electrode 62 and the gate insulating film 82, and a source electrode 64 and a drain electrode 66 separately formed on the semiconductor layer 84. In order to protect such a thin film transistor part, a storage insulating film 88 and first and second protective films 90 and 86 are provided. The storage insulating film 88 and the second protective film 86 are made from an inorganic insulating material while the first protective material 90 is made from an organic material.

A first drain contact hole 65a passing through the storage insulating film 88 is provided on the storage insulating film 88. A second drain contact hole 65b passing through the first protective film 90 centering around the first drain contact hole 65a is provided on the first protective film 90. The first drain contact hole 65a and the second drain contact hole 65b pass through the storage insulating film 88 and the first protective film 90, which each have different etching ratio, respectively, to prevent an undercut phenomenon of the conventional storage insulating film. A transparent drain electrode 77 and a drain electrode 66 provided on the first protective film 90 are electrically connected to each other via the first and second drain contact holes 65a and 65b.

In order to protect the transparent drain electrode 77, a second protective film 86 is provided on the first protective film 90. A pixel electrode 55 in contact with the transparent drain electrode 77 via a third contact hole 65c passing through the second protective film 86 is provided on the second protective film 86. Thus, the drain electrode 66 and the pixel electrode 55 are in electrical contact with each other via the first to third contact holes 65a, 65b and 65c.

The charge capacitor part Cst consists of a storage electrode 75, and the pixel electrode 55 positioned at the upper portion of the storage electrode 75 with the second protective film 86 therebetween. The lower portion of the storage electrode 75 is provided with a ground line 72 for resetting residual charges of the charging capacitor Cst. The ground line 72 and the storage electrode 75 are in electrical contact with each other via a first storage contact hole 67a passing through the storage insulating film 88 and a second storage contact hole 67b passing through the first protective film 90. The second storage contact hole 67b is centered around the first storage contact hole 65a to prevent an undercut phenomenon of the conventional storage insulating film.

FIG. 5A to FIG. 5H are section views showing a method of fabricating an X-ray detecting device according to an embodiment of the present invention step by step, which emphasize a thin film transistor part and a storage capacitor part.

Referring first to FIG. 5A, a gate electrode 62 is provided on the substrate 52. The gate electrode 62 is formed by sequentially depositing an aluminum layer 62a and a molybdenum layer 62b using a deposition technique such as a sputtering, etc. and then patterning them.

Referring to FIG. 5B, an active layer 84a and an ohmic contact layer 84b are provided on a gate insulating film 82.

The gate insulating film 82 is formed by entirely depositing an insulating material onto the substrate 52 by the plasma enhanced chemical vapor deposition (PECVD) technique or the like in such a manner to cover the gate electrode 62. The active layer 84a and the ohmic contact layer 84b are formed by disposing first and second semiconductor materials on the gate insulating film 82 and then patterning them. The gate insulating film 82 is made from an insulating material such as silicon nitride ($SiN_x$) or silicon oxide ($SiO_x$), etc. The active layer 84a is made from undoped amorphous silicon, which is the first semiconductor layer. The ohmic contact layer 84b is made from a doped amorphous silicon which is doped with an impurity, which is the second semiconductor layer.

Figure 5C:
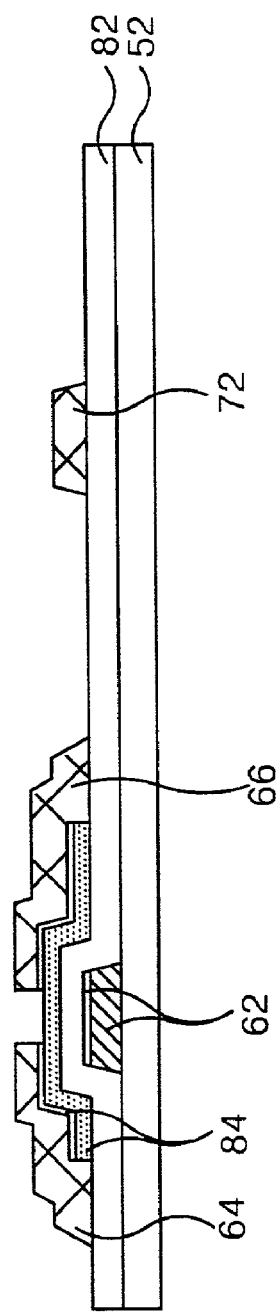
FIG. 5A and FIG. 5H are section views representing a method of fabricating the X-ray detecting device shown in FIG. 4.

Referring to FIG. 5C, a source electrode 64, a drain electrode 66 and a ground line 72 are provided on the gate insulating film 82.

The ground line 72, the source electrode 64 and the drain electrode 66 are formed by depositing a metal layer using the chemical vapor deposition, sputtering technique or the like and patterning it. After the source and drain electrodes 66 and 64 are patterned, the ohmic contact layer 84b at an area corresponding to the gate electrode 62 also is patterned to expose the active layer 84a. A portion of the active layer 84a corresponding to the gate electrode 62 between the source and drain electrodes 64 and 66 makes a channel. The ground line 72 and the source and drain electrodes 64 and 66 are formed from chrome (Cr) or molybdenum (Mo), etc.

Figure 5D:
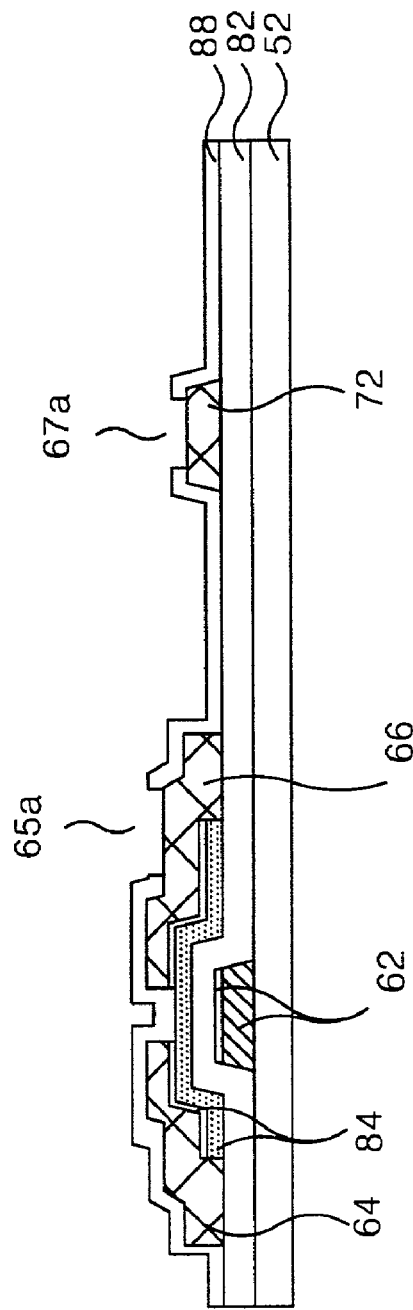

Referring to FIG. 5D, a storage insulating film 88 is provided on the gate insulating film 82.

The storage insulating film 88 is formed by depositing an inorganic insulating material onto the gate insulating film 82 and patterning it in such a manner to cover the source electrode 64, the drain electrode 66 and the ground line 72. A first drain contact hole 65a and a first storage contact hole 67a passing through the storage insulating film 88 are provided on the storage insulating film 88 in such a manner to expose a portion of the surfaces of the drain electrode 66 and the ground line 72. The storage insulating film 88 is made from an inorganic insulating material such as silicon nitride ($SiN_x$) or silicon oxide ($SiO_x$), etc.

Figure 5E:
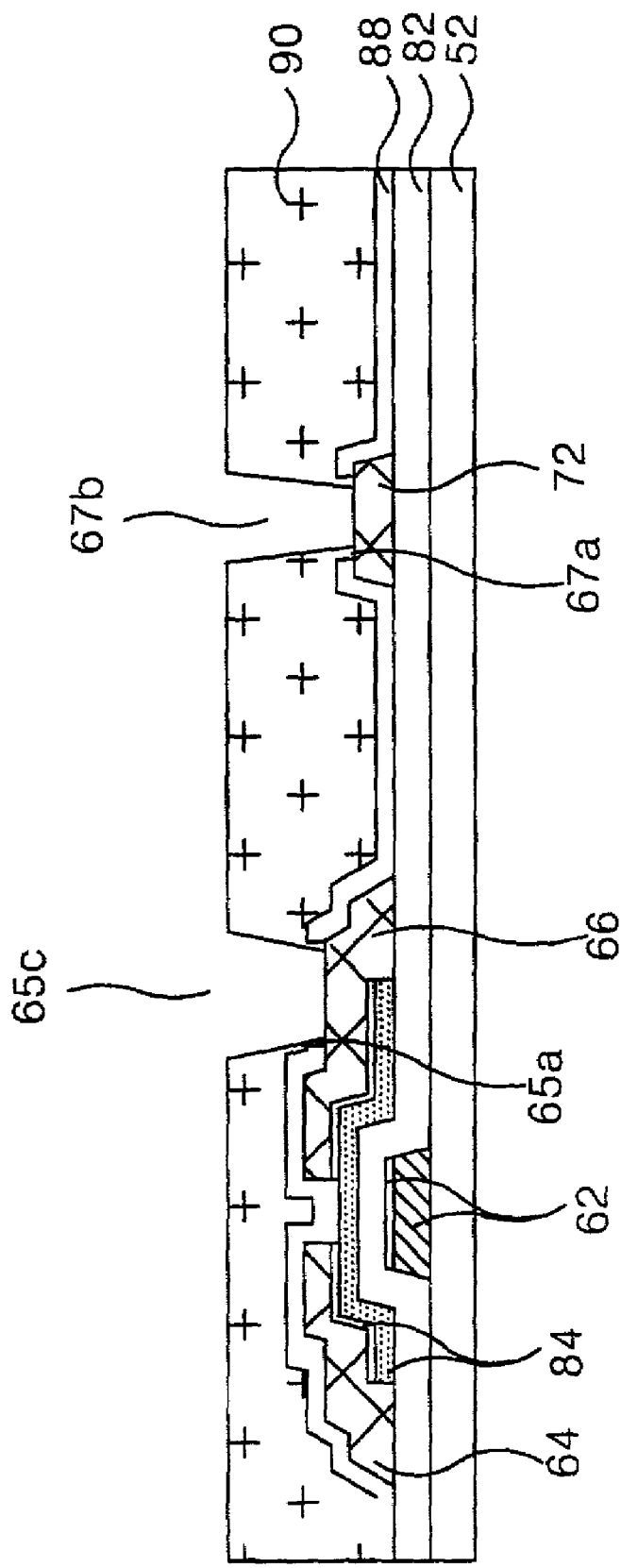

Referring to FIG. 5E, the first protective film 90 is provided on the storage insulating film 88.

The first protective film 90 is formed by depositing an insulating material onto the storage insulating film 88 and then patterning it. A second drain contact hole 65b and a second storage contact hole 67b passing through the first protective film 90 are provided on the first protective film 90, the first drain contact hole 65a and the first storage contact hole 67a having already been provided.

The first protective film 90 is made from an organic insulating material such as an acrylic organic compound, Teflon, BCB (benzocyclobutene), Cytop or PFCB (perfluorocyclobutane), etc. which is the second insulating material.

Figure 5F:
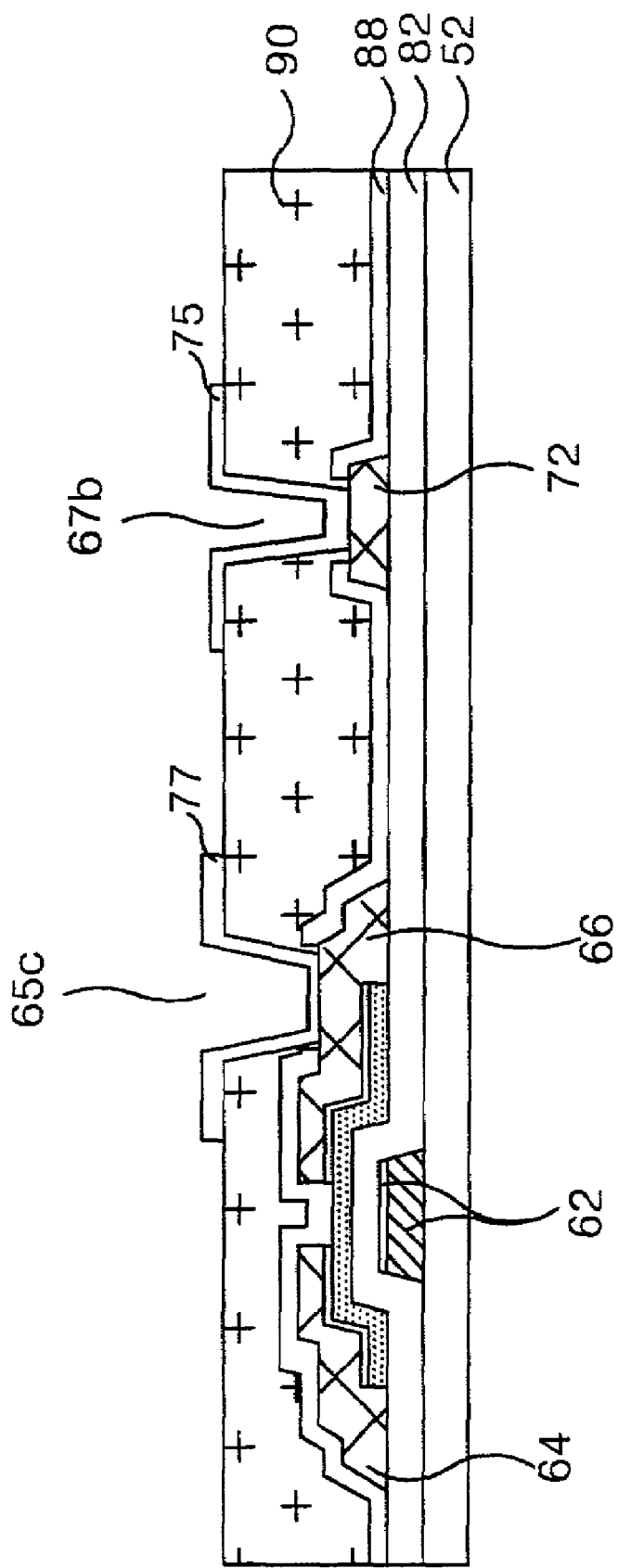

Referring to FIG. 5F, a transparent drain electrode 77 and a storage electrode 75 are provided on the first protective film 90.

The transparent drain electrode 77 and the storage electrode 75 are formed by depositing a transparent conductive material onto the first protective film 90 and then patterning it. The transparent drain electrode 77 is electrically connected to the drain electrode 66 via first and second drain contact holes 65a and 65b, while the storage electrode 75 is electrically connected to the ground line 72 via first and second storage contact holes 67a and 67b.

The transparent drain electrode 77 and the storage electrode 75 are made from any one of indium-tin-oxide (ITO), indium-zinc-oxide (IZO) and indiumtin-zinc-oxide (ITZO).

Figure 5G:
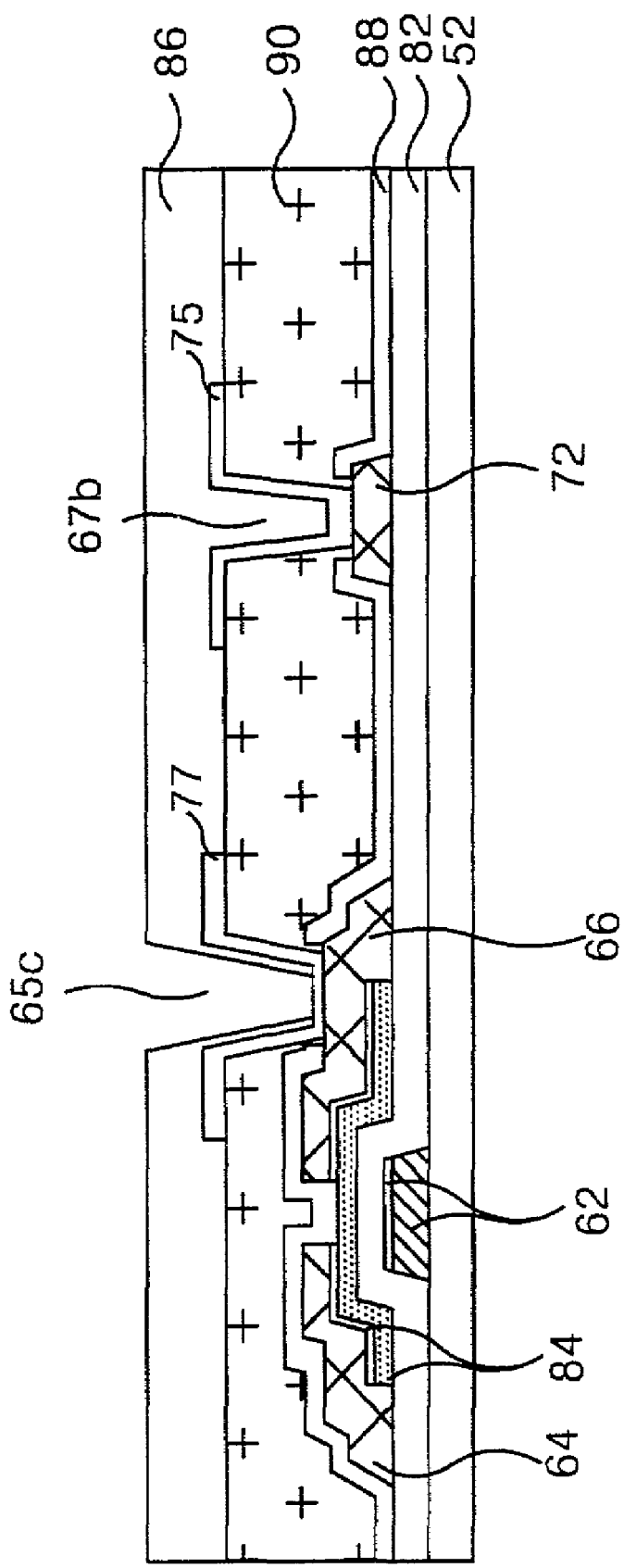

Referring to FIG. 5G, a second protective film 86 is provided on the first protective film 90.

The second protective film 86 is formed by depositing an insulating material onto the first protective film 90 and then patterning it in such a manner to cover the transparent drain electrode 77 and the storage electrode 75. On the second protective film 86, a third drain contact hole 65c passing through the second protective film 86 is provided in such a manner to expose a portion of the surface of the transparent drain electrode 77. The second protective film 86 is an inorganic insulating material such as silicon nitride ($SiN_x$) or silicon oxide ($SiO_x$), etc.

Figure 5H:
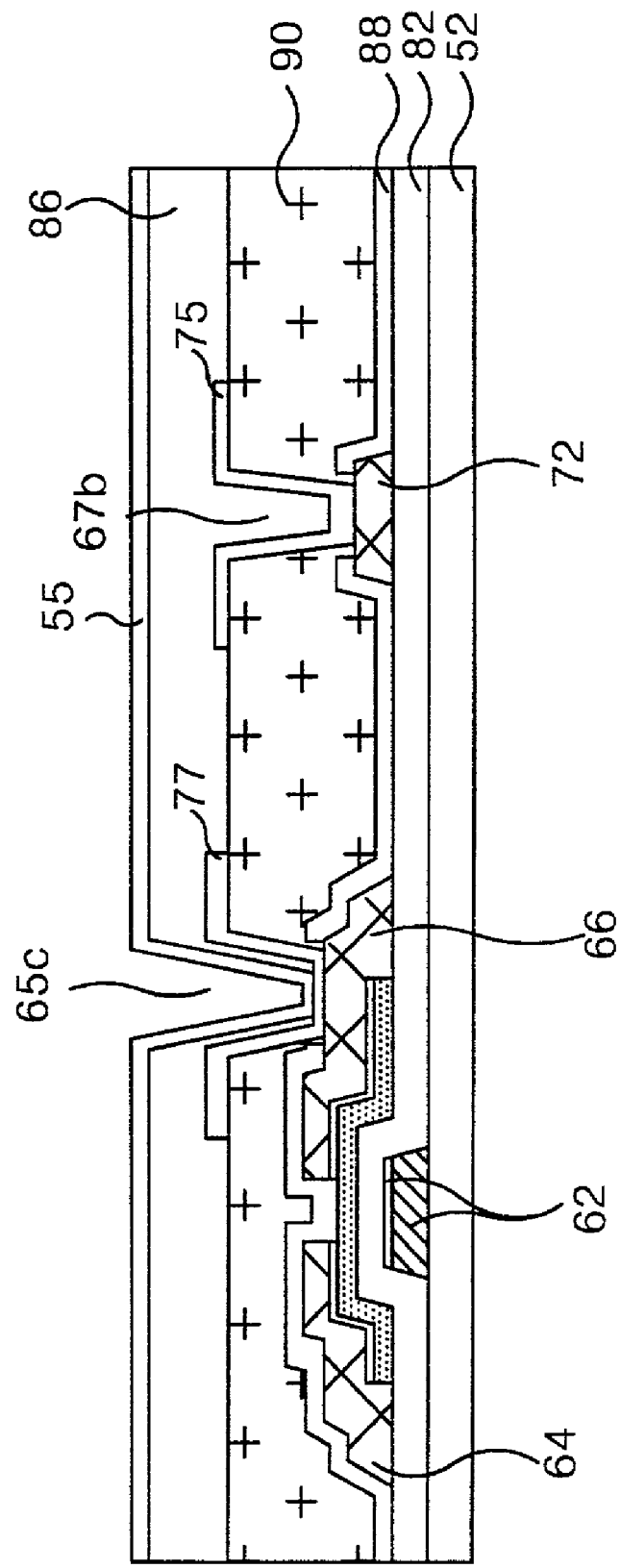

Referring to FIG. 5H, a pixel electrode 55 is provided on the second protective layer 86.

The pixel electrode 55 is formed by depositing a transparent conductive material such as ITO, IZO or ITZO onto the second protective layer 86 and then patterning it. The pixel electrode 55 electrically contacts the drain electrode 66 via the first to third drain contact holes 65a, 65b and 65c.

As described above, according to the present invention, the contact hole passing through the protective film is formed centering around the contact hole passing through the storage insulating film. Accordingly, the contact hole passing through the storage contact hole has a larger width than the contact hole passing through the protective film to stabilize the step coverage of the transparent electrode provided on the protective film, so that it becomes possible to prevent breakage of the transparent electrode.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An X-ray detecting device, comprising:
   a thin film transistor having a gate electrode, a source electrode and a drain electrode provided on a substrate;
   a first protective film covering the thin film transistor;
   a first drain contact hole passing through the first protective film;
   a second protective film provided on the first protective film;
   a second drain contact hole passing through the second protective film centering around the drain contact hole; and
   a transparent electrode connected to the drain electrode via the first and second drain contact holes, wherein the first protective film is spaced apart from the transparent electrode in the first drain contact hole by the second protective film.

2. The X-ray detecting device according to claim 1, wherein the second drain contact hole passes through the predetermined region of the second protective film filled in the first drain contact hole and has a smaller width than the first drain contact hole.

3. The X-ray detecting device according to claim 1, further comprising:
   a ground line having the lower electrode of a storage capacitor on the substrate;
   a first storage contact hole passing through the first protective film covering the ground line;
   a second storage contact hole passing through the second protective film centering around the first storage contact hole; and
   a storage electrode electrically connected to the ground line via the first and second storage contact holes.

4. The X-ray detecting device according to claim 3, wherein the first protective film is made from an inorganic insulating material.

5. The X-ray detecting device according to claim 3, wherein the second protective film is made from an organic insulating material.

6. The X-ray detecting device according to claim 5, further comprising:
   a third protective film provided on the second protective film; and
   a pixel electrode electrically connected to the drain electrode via a contact hole passing through the third protective film.

7. The X-ray detecting device according to claim 3, further comprising:
   a third protective film provided on the second protective film; and
   a pixel electrode electrically connected to the drain electrode via a contact hole passing through the third protective film.

8. The X-ray detecting device according to claim 3, wherein the second storage contact hole passes through the predetermined region of the second protective film filled in the first storage contact hole and has a smaller width than the first storage contact hole.

9. A method of fabricating an X-ray detecting device, comprising the steps of:
   providing a gate electrode on a substrate; providing a gate insulating film on the substrate;
   providing a semiconductor layer on the gate insulating film;
   providing a source electrode and a drain electrode on the gate insulating film;
   providing a first protective film on the gate insulating film;
   providing a first drain contact hole passing through the first protective film;
   providing a second protective film on the first protective film;
   providing a second drain contact hole passing through the second protective film centering around the first drain contact hole; and
   providing a transparent electrode on the second protective film, wherein the first protective film is spaced apart from the transparent electrode in the first drain contact hole by the second protective film.

10. The method according to claim 9, wherein the second drain contact hole passes through the predetermined region of the second protective film filled in the first drain contact hole and wherein the first drain contact hole has a larger width than the second drain contact hole.

11. The method according to claim 9, further comprising the steps of:
   forming a ground line simultaneously with the source and drain electrodes;
   forming a first storage contact hole passing through the first protective film covering the ground line;
   forming a second storage contact hole passing through the second protective film centering around the first storage contact hole; and
   forming a transparent electrode on the second protective film.

12. The method according to claim 11, further comprising the steps of:
   forming a third protective film on the second protective film; and
   forming a pixel electrode on the third protective film.

13. The method according to claim 11, wherein the second storage contact hole passes through the predetermined region of the second protective film filled in the first storage contact hole and wherein the first storage contact hole has a larger width than the second storage contact hole.

14. The method according to claim 11, wherein the first protective film is made from an inorganic insulating material.

15. The method according to claim 11, wherein the second protective film is made from an organic insulating material.

* * * * *